United States Patent [19]
Volk et al.

[11] Patent Number: 6,166,563
[45] Date of Patent: Dec. 26, 2000

[54] METHOD AND APPARATUS FOR DUAL MODE OUTPUT BUFFER IMPEDANCE COMPENSATION

[75] Inventors: Andrew M. Volk, Granite Bay; Jennefer Asperheim, El Dorado Hills; Hou-Sheng Lin, Sacramento; Romesh Trivedi, Folsom, all of Calif.

[73] Assignee: Intel Corporation, Santa Clara, Calif.

[21] Appl. No.: 09/299,771

[22] Filed: Apr. 26, 1999

[51] Int. Cl.[7] .............................................. H03K 19/0175
[52] U.S. Cl. ................................... 326/87; 326/86; 326/30
[58] Field of Search .................................. 326/87, 86, 30

[56] References Cited

U.S. PATENT DOCUMENTS

| 6,040,714 | 3/2000 | Klein | 326/86 |
| 6,054,881 | 4/2000 | Stoenner | 326/112 |

OTHER PUBLICATIONS

Knight, Thomas F. Jr. et al, "A self–terminating low–voltage swing CMOS output driver", IEEE Journal of Solid–State Circuits, vol. 23, No. 2, Apr. 1988, p. 457–464.

Gabara T., et al, "Digitally adjustable resistors in CMOS for high–performance applications", IEEE Journal of Solid–State Circuits, pp. 1176–1185, Aug. 1992.

Knight, Thomas F. Jr. et al, "Automatic Impedance Control", Proceedings of the 1993 IEEE International Solid–State Circuits Conference, p. 164–165.

Trotter, J.D. et al, "CMOS low voltage high performance interface", Proceedings of the 7th IEEE International ASIC Conference and Exhibit, 1994, p. 44–48.

Takahashi, Toshiro et al, "CMOS gate array with 600 Mb/s simultaneous bi–directional I/O circuits", Proceedings of the 1995 ISSCC, v 30 n 12 p. 1544–1546.

Pilo, Harold et al, "300MHz, 3.3V 1Mb SRAM fabricated in a 0.5μm CMOS process", Proceedings of the 1996 IEEE International Solid–State Circuits Conference, p. 148–149.

*Primary Examiner*—Michael Tokar
*Assistant Examiner*—Anh Tran
*Attorney, Agent, or Firm*—Blakely, Sokoloff, Taylor & Zafman LLP

[57] ABSTRACT

A method and circuit for programming an output buffer having a first output driver for producing a first signaling level with a first programmable strength and a second output driver for producing a second signaling level with a second programmable strength. The method includes coupling a test resistor between a source of the second signaling level and a mode terminal, sensing a first level at the mode terminal, and uncoupling the test resistor from the mode terminal. If the first level is between the second signaling level and a reference level, then programming the output buffer with reference to an unterminated transmission line coupled to the mode terminal. Otherwise, programming the output buffer with reference to an external resistor coupled between a source of the first signaling level and the mode terminal. The circuit includes a first counter coupled to the first comparator to produce a first value responsive to the mode flag, the mode terminal, and the reference level. A first latch, coupled to the first counter, provides the adjusted first value to the first output driver. A second latch, coupled to the second counter, provides the adjusted second value to the second output driver.

21 Claims, 10 Drawing Sheets

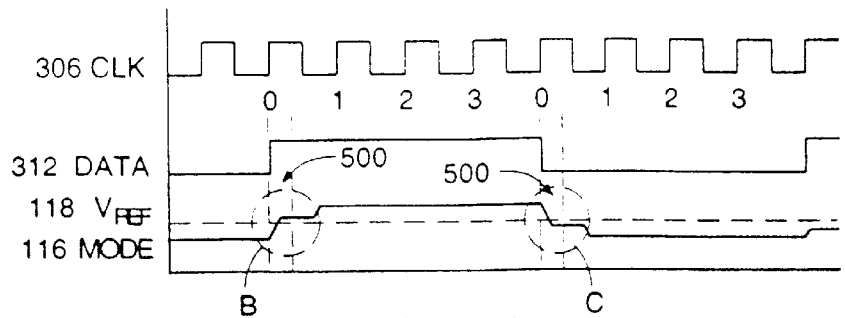
*FIG. 5A*
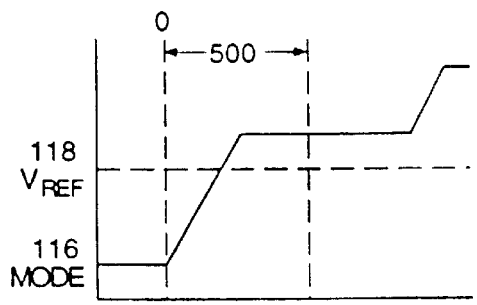   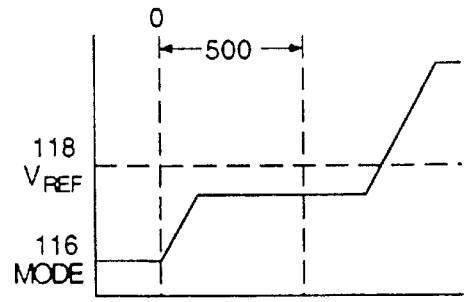
*FIG. 5B1*                   *FIG. 5B2*
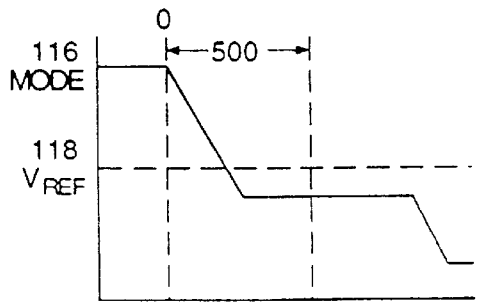   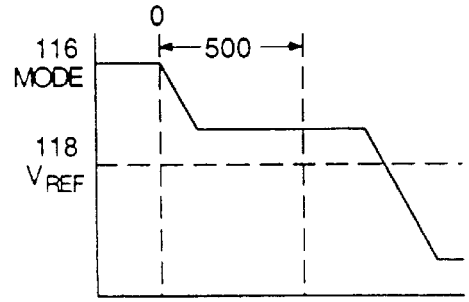
*FIG. 5C1*                   *FIG. 5C2*

METHOD AND APPARATUS FOR DUAL MODE OUTPUT BUFFER IMPEDANCE COMPENSATION

BACKGROUND OF THE INVENTION

1. Field of the Invention

This invention relates to digital output buffers and, more particularly, to digital output buffers with a control system that automatically adjusts the impedance compensation of the buffers.

2. Background Information

Digital data is communicated between integrated circuits over traces on printed circuit boards. These traces may be all on one printed circuit board or may be connected from a motherboard to a daughterboard. Such connections generally have lengths of several inches. When such connections are used to transmit data at higher speeds, such as speeds with a signaling rate of 100 MH or above, the trace behavior as a transmission line becomes increasingly important. To achieve reliable data transfer, the impedance of the output buffers must be compensated for the impedance of the transmission lines.

Output buffers are used to transmit data on the transmission lines. Differential line receivers are used to receive data from the transmission lines. Data is transmitted by transmitting a voltage that is higher or lower than a reference voltage. The differential line receivers compare the received voltage to the reference voltage to detect the transmitted data. Output buffers typically include a pair of driver circuits. One driver circuit pulls the transmission line to a voltage above the reference voltage to represent a first data state. The second driver circuit pulls the transmission line to a voltage below the reference voltage to represent a second state.

Output buffers may be programmably compensated for impedance by a driver circuit having two or more legs that can be independently enabled to provide programmable drive strength. The drive strength should be adjusted to compensate for the transmission line characteristics of the circuit board and also for variations in the circuit characteristics as fabricated. Accordingly, there is a need for output buffers that can automatically compensate for transmission line impedance in a variety of applications.

SUMMARY OF THE INVENTION

A method and circuit for programming an output buffer having a first output driver for producing a first signaling level with a first programmable strength and a second output driver for producing a second signaling level with a second programmable strength. The method includes coupling a test resistor between a source of the second signaling level and a mode terminal, sensing a first level at the mode terminal, and uncoupling the test resistor from the mode terminal. If the first level is between the second signaling level and a reference level, then programming the output buffer with reference to an unterminated transmission line coupled to the mode terminal. Otherwise, programming the output buffer with reference to an external resistor coupled between a source of the first signaling level and the mode terminal. The circuit includes a first counter coupled to the first comparator to produce a first value responsive to the mode flag, the mode terminal, and the reference level. A first latch, coupled to the first counter, provides the adjusted first value to the first output driver. A second latch, coupled to the second counter, provides the adjusted second value to the second output driver.

BRIEF DESCRIPTION OF THE DRAWINGS

FIG. 5A is an illustrative set of waveforms that may be generated by the compensation circuit in the unterminated transmission line mode.

FIGS. 5B1, 5B2, 5C1, and 5C2 are details of waveforms in FIG. 5A.

DETAILED DESCRIPTION OF THE INVENTION

Figure 1:
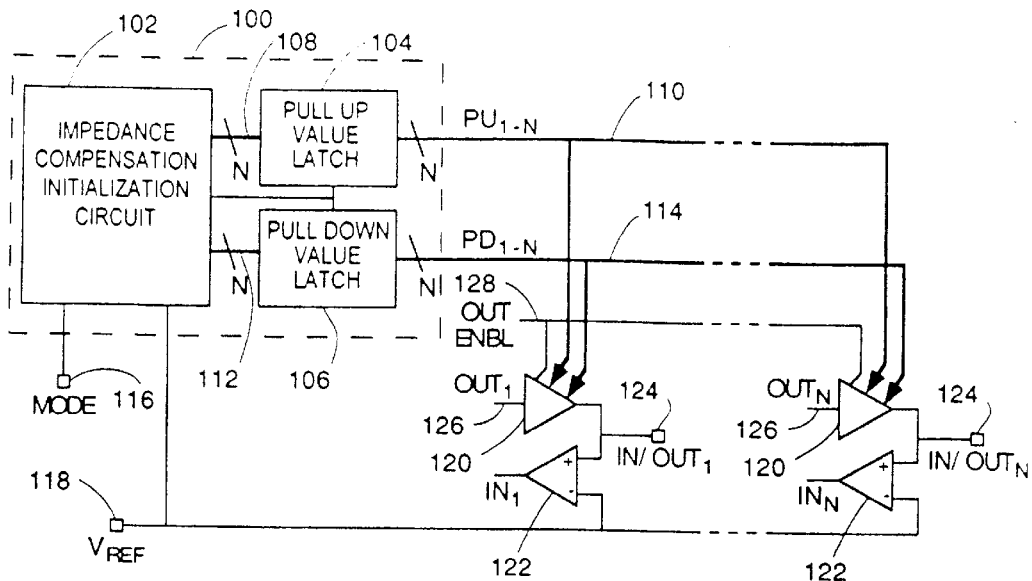
FIG. 1 is a block diagram of an exemplary data transmission system that embodies the invention.

FIG. 1 is a block diagram illustrating output buffers that are programmed using an embodiment of the present invention. One or more bi-directional input/output buffers are provided. Each buffer includes a differential line receiver 122 and an output buffer 120. The output of the buffer and the input of the receiver are tied together and brought to a common in/out terminal 124. The differential line receiver has two inputs. One input is the signal received on the in/out terminal. The other signal is a reference voltage to which the received signal is compared. The reference voltage is received on a $V_{ref}$ terminal 118. An output enable signal 128 may be provided to disable the output of the buffers when no data is being placed onto the output pin by the output buffer. When the output is disabled, the output buffer is in a tri-state condition.

Figure 2:
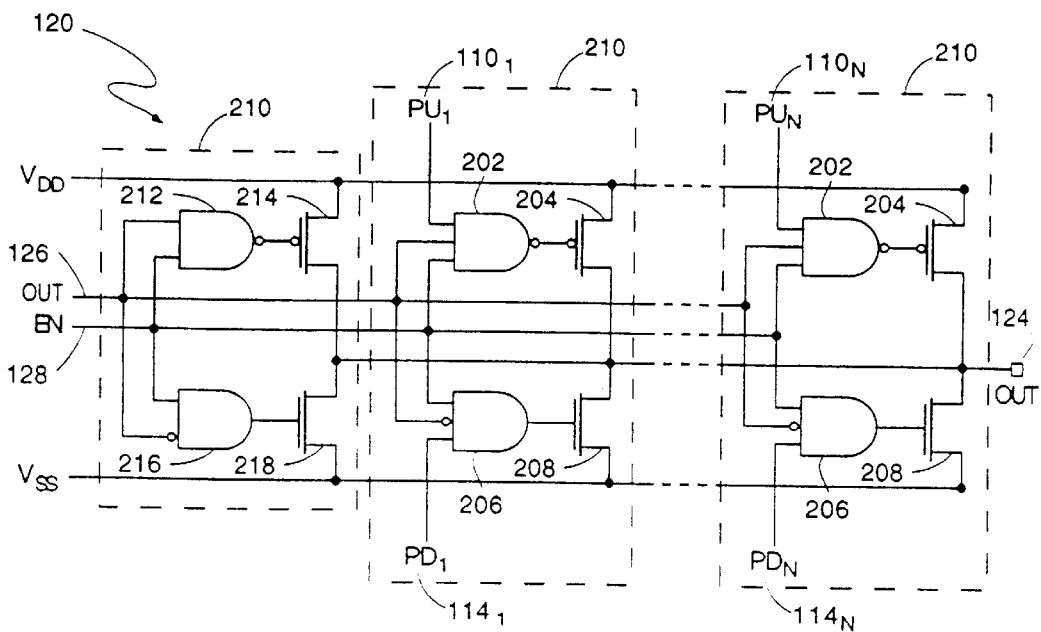
FIG. 2 is a representational circuit diagram for an exemplary output driver.

FIG. 2 illustrates an implementation of the output buffer 120. The output driver is made up of a number of legs 200 each of which provides a driver function with a certain amount of internal resistance. The legs may be fabricated such that the strength of the legs has a binary relationship. The driver may also include an anchor leg 210 which is identical to the remaining legs except that the anchor leg is not programmable. The anchor leg is always active when the buffer is enabled and provides a baseline minimum strength for the driver. In another embodiment, all the legs are programmable and no anchor leg is used. In this embodiment, at least one programmable leg must always be active when the buffer is enabled.

Each leg includes a pull-up driver made up of a logic section 202 and a P-channel transistor 204 that connects the output of the driver to a voltage higher than the reference voltage. Each leg also includes a pull-down driver made up of logic 206 and an N-channel transistor 208 to connect the output to a voltage lower than the reference voltage. The pull-up and pull-down drivers work similarly although they work with opposite logic senses. It will be observed that output data provided to the pull-up logic 202 must be high to turn on the pull-up transistor 204 while output data supplied to the pull-down logic section 206 must be low to turn on the pull-down transistor 208. A pull-up or pull-down transistor is turned on when the proper output data 126 is supplied to the logic section, the enable line 128 is driven to the enabling state, and the pull-up 110 or pull-down values 114 are in the proper state to enable the leg. The enable line enables or disables all the transistors in the buffer. The pull-up value 110 selectively enables the pull-up transistors 204 of the programmable legs of the buffer and, similarly, the pull-down value 114 selectively enables the pull-down transistors 208. Output data 126 then turns on the enabled pull-up transistors 204 or pull-down transistors 208 as appropriate. In this way, a programmable strength driver responsive to a set of pull-up signals and a set of pull-down signals can be constructed. It will be appreciated by those skilled in the art that a variety of different logic arrangements can be used to provide an equivalent programmable output buffer.

Referring again to FIG. 1, it will be seen that the pull-up value 110 and the pull-down value 114 are provided to the buffers 120 in parallel from a pull-up value latch 104 and a pull-down value latch 106. The values in these latches determine the strengths of the pull-up and pull-down sections of the buffers. The impedance compensation initialization circuit 102 receives a mode input on the mode terminal 116 and a $V_{ref}$ input 118 to determine appropriate pull-up and pull-down values to place into the latches 104, 106.

Figure 3A:
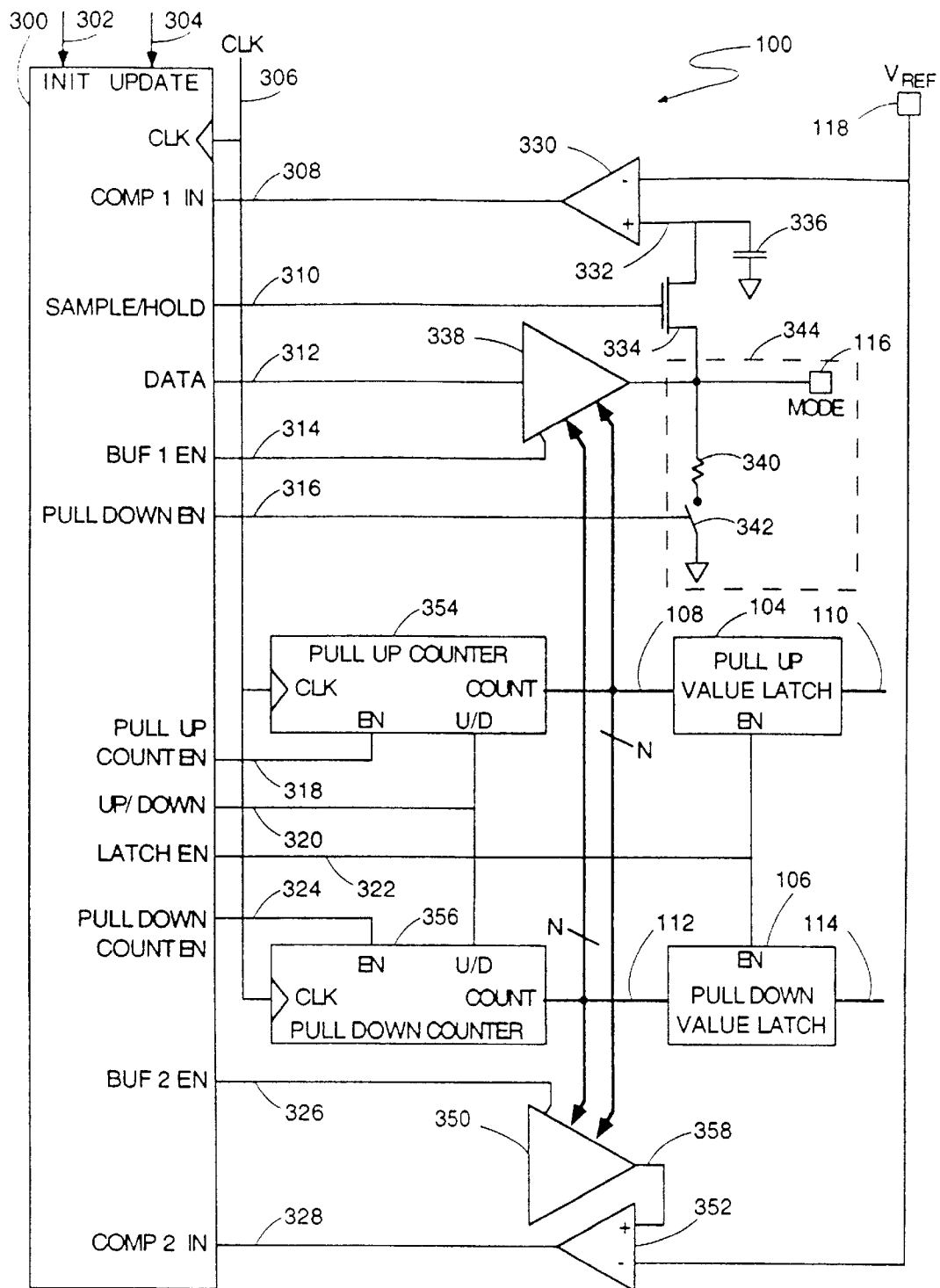
FIG. 3A is a schematic diagram an embodiment of the compensation circuit.

FIG. 3A illustrates a compensation circuit for an output buffer embodying the present invention. A pull-down resistor 340, is switchably connected to ground through a switch 342 controlled by a logic circuit 300 using a pull-down enable line 316. The pull-down resistor is coupled to the mode terminal 116. A first comparator 330 is also coupled to the mode terminal through a sample and hold circuit. The sample and hold circuit includes a capacitor 336 and a transistor 334 controlled by the logic circuit using a sample and hold line 310. The comparator senses the difference between the voltage at the mode terminal and the reference voltage supplied on the $V_{ref}$ terminal 118. The comparator results are supplied to the logic circuit on a first comparator input line 308.

Figure 3B:
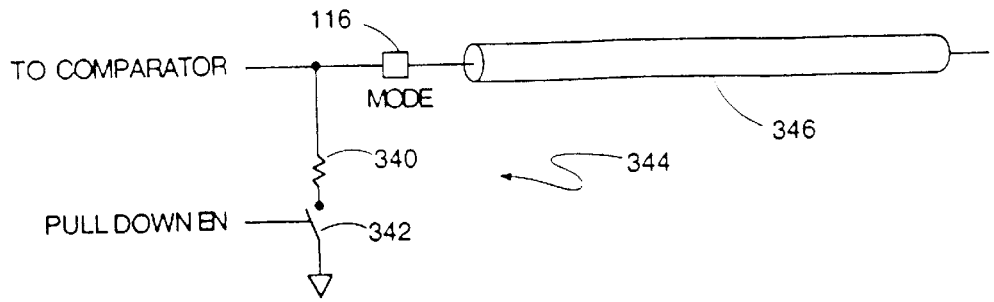
FIG. 3B illustrates the connection of an unterminated transmission line to the circuit of the invention.
Figure 3C:
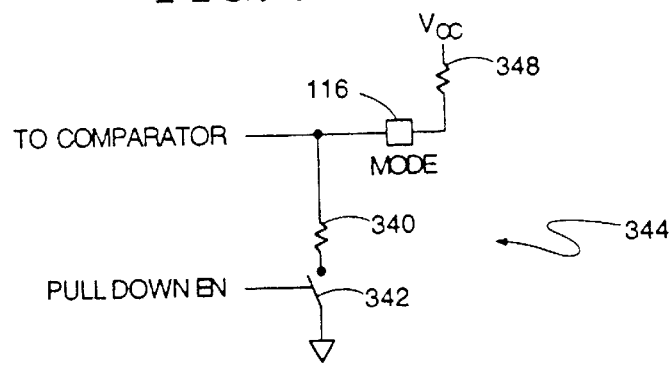
FIG. 3C illustrates the connection of an external resistor to the circuit of the invention.

The mode terminal 116 connects a passive external circuit to the impedance compensation initialization circuit 102. The initialization circuit senses the type of external circuit connected to the mode pin to establish a compensation mode. As may be in seen in FIGS. 3B and 3C, there are two types of external circuits that may be connected to the mode terminal. Shown in FIG. 3B is the connection of an unterminated transmission line 346. In FIG. 3C, a pull-up resistor 348 is connected to the mode terminal. The initialization circuit operates differently depending on whether an unterminated transmission line or a pull-up resistor is connected to the mode terminal. Each of these modes of operation has advantages and disadvantages as compared to the other mode.

When the initialization circuit 102 is connected to an unterminated transmission line 346 on the mode terminal 116, the impedance of the buffers 120 is compensated against the transmission line. This provides a direct compensation of the board transmission line characteristics and will be more accurate over all board variations. However, this does require that a long transmission line be connected to the mode pin and this may be inconvenient in certain board designs.

Compensation against a pull-up resistor 348 allows the impedance compensation to be controlled independently of board parameters. This is especially useful when the signal is routed from a motherboard to a daughterboard, where the characteristic impedances of the daughterboard may differ from those of the motherboard.

Upon receipt of an initialization signal 302, a mode detection process is started. The logic circuit 300 connects the pull-down resistor 340 to ground by closing switch 342 using the pull-down enable line 316. The sample and hold transistor 334 is turned on and the first comparator 330 senses the voltage at the mode terminal 116. It should be noted that the sample and hold circuit is not used for this measurement but it is merely turned on to allow the signal to pass through to the comparator. If the pull-down transistor pulls the voltage at the mode terminal to a low level, connection of an unterminated transmission line 346 is indicated. The logic circuit 300 senses the low level on the mode terminal and sets a mode flag (not shown) indicating that the circuit is operating in the unterminated transmission line mode. The pull-down resistor 340 is a weak pull-down chosen so that the voltage at the mode terminal will be at a high level if a pull-up resistor 348 is connected to the mode terminal. The comparator senses the high level and the mode flag is set to indicate that the compensation circuit is in the pull-up resistor termination mode. Once the mode has been determined, pull-down enable 316 is released, opening switch 342, and disconnecting pull-down resistor 340. The logic circuit then begins an adjusting process based on the mode detected. The adjusting process may also be started by supplying an update signal 304 to the logic circuit 300 which adjusts based on the previously detected mode.

Figure 7:
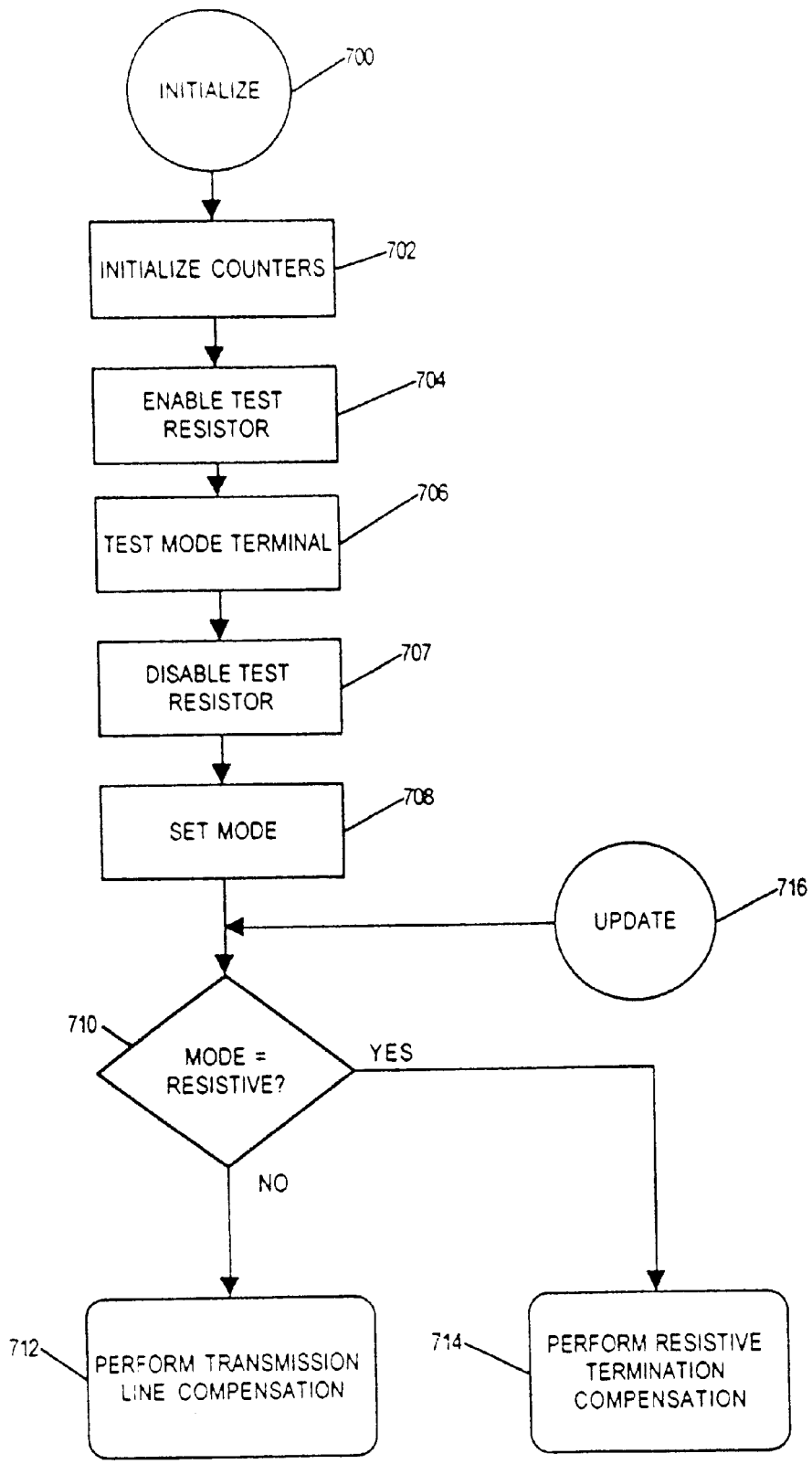
FIG. 7 is a flowchart for the mode determination process of an embodiment of the invention.

FIG. 7 illustrates a flowchart for mode detection according to the present invention. The process begins when the initialization signal 302 is received 700. In one embodiment, the counters 354, 356 are initialized 702. The pull-down resistor 340 is enabled 704. After a settling time delay, the voltage at the mode terminal 116 is tested 706 and the pull-down resistor is disabled 707. If the voltage indicates that an unterminated transmission line is connected to the mode terminal, then transmission line mode is set 708, otherwise resistive termination mode is set 708. If the mode is not resistive 710-NO, then transmission line compensation is performed 712. If the mode is resistive termination 710-YES, then resistive termination compensation is performed 714. If the update signal 304 is received 716, then the previously determined mode is used 710 to select transmission line compensation 712 or resistive termination compensation 714.

A first compensation buffer 338 is used to drive the unterminated transmission line 346 through the mode terminal 116 to perform transmission line compensation. The first compensation buffer is substantially similar to the output buffers 120 as shown in FIG. 2. In some embodiments, the first compensation buffer may have a greater number of legs 200 than the output buffers to provide an over-sampling effect. In such embodiments, the number of lines between the counters 354, 356 and the compensation circuit buffers 338, 350 will be greater than the number of lines between the value latches 104, 106 and the output buffers 120.

The logic circuit supplies the enable signal 314 and the data line 312 for the first compensation buffer. The pull-up and pull-down values are supplied by a pull-up counter 354 on pull-up lines 108 and a pull-down counter 356 on pull-down lines 112. The pull-up counter and the pull-down counter are tied to a clock line 306. Typically, this clock operates at a conveniently available clock rate. The period of the clock used to drive the logic should be greater than the time for a transmitted edge to be reflected back to the mode terminal 116 to allow the voltage at the mode terminal to settle before the next edge is sent. The clock period should also be long enough to allow the results of the sample and hold to resolve in the comparator to a good logic level. In one embodiment, a clock rate of 66 MHz is used. The logic circuit supplies a common up/down control 320 to both counters and an individual pull-up count enable 318 and pull-down count enable 324. The counter values program the strength of the first compensation buffer. In one embodiment, the counters are not initialized and wraps around between the high and low counts. In another embodiment, the counter is initialized to the midpoint value and counts between one and the maximum count value without wraparound.

Figure 8A:
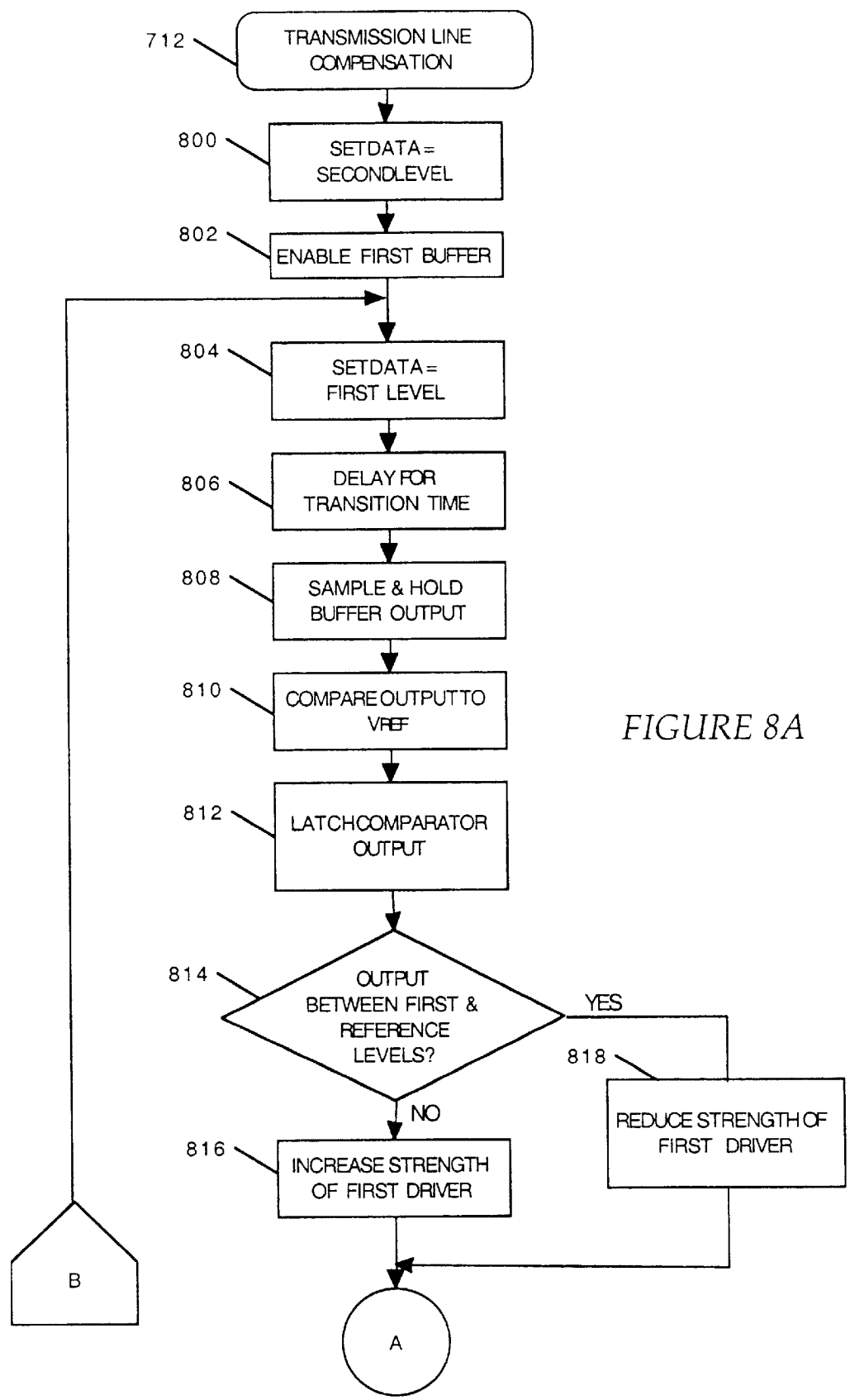
FIGS. 8A and 8B are a flowchart for the impedance compensation process in the unterminated transmission line mode of an embodiment of the invention.
Figure 8B:
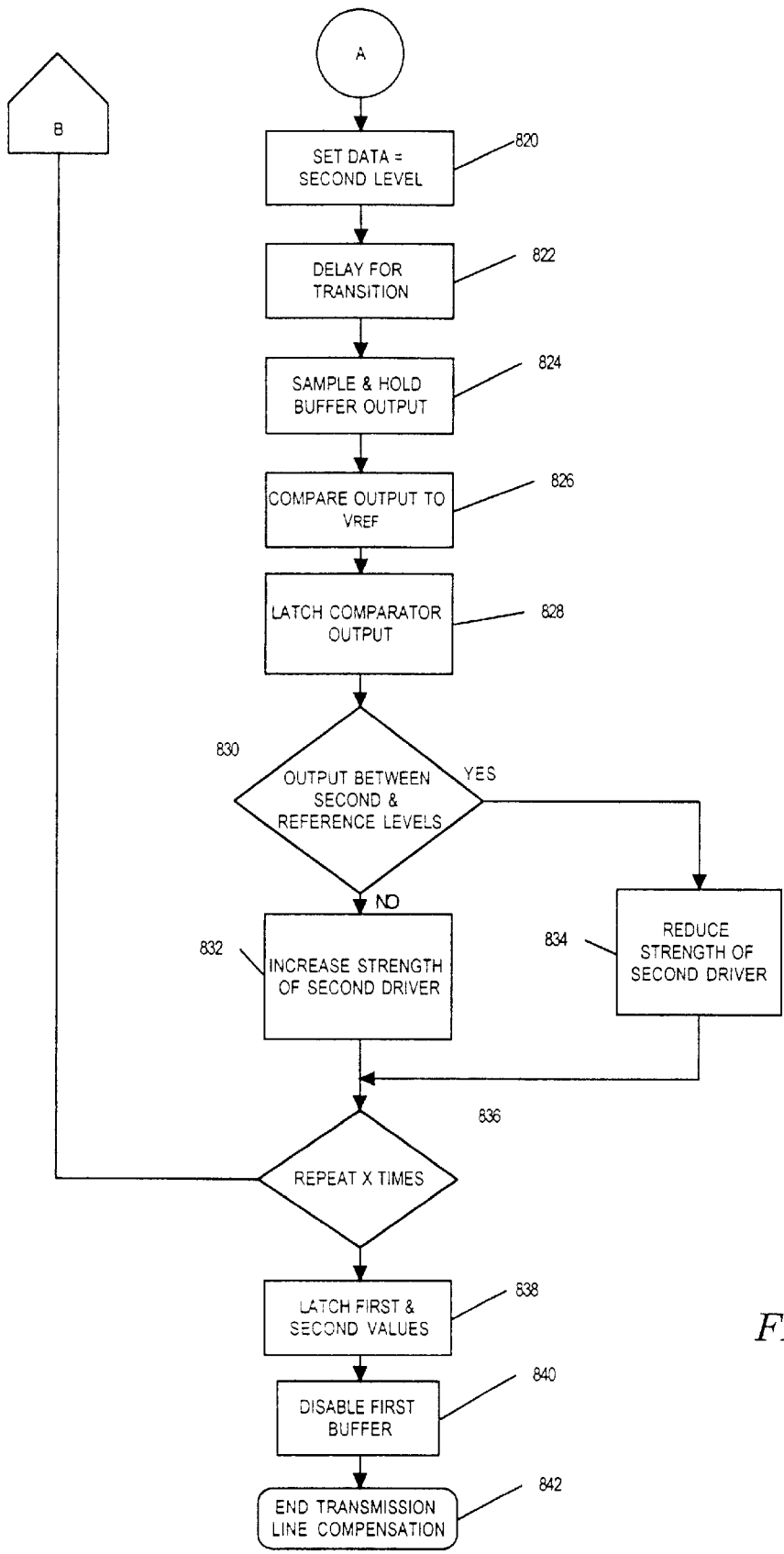

FIGS. 8A and 8B are exemplary flowcharts for the adjusting process in transmission line mode. The logic circuit 300 sets data 312 to zero 800 and sets the first buffer enable 314 to enable the first compensation buffer 802. This creates an initial condition of the first compensation buffer driving the transmission line 346 to the low state. After a settling delay, the logic circuit sets data to one 804 transmitting a rising edge on the transmission line.

FIGS. 5A through 5C2 illustrate waveforms that may be present when the circuit is adjusting the impedance compensation in the unterminated transmission line mode. FIG. 5A shows the clock signal 306, the data signal 312 that is supplied to the first compensation buffer 338, the $V_{ref}$ level 118, and the voltage at the mode terminal 116. FIGS. 5B1 and 5B2 are details of the rising edge at the mode terminal. FIGS. 5C1 and 5C2 are details of the falling edge at the mode terminal.

After a short delay 806 that is longer than the maximum rise time for the buffer 338 and shorter than the time for the transmitted rising edge to be reflected back to the mode terminal 116 and the transmission line 346, typically a few nanoseconds, the logic circuit 300 briefly enables the sample and hold line 310 to capture the voltage at the mode terminal 808. The voltage level following the transition and before the reflection reinforces the level is termed the ledge voltage. The sample and hold captures the ledge voltage. The delay between the transition and sampling is shown by distance 500 between the two vertical dashed lines around each transition. It will be appreciated that the sample and hold circuit also provides low pass filtering, which stabilizes the compensation process. The sampled voltage is compared to $V_{ref}$ 810 and the comparator output is latched 812. If the ledge voltage is greater than $V_{ref}$ 814-YES, then the buffer pull-up strength is too great, as illustrated by FIG. 5B1. The logic circuit reduces the pull-up strength 818 by decrementing the pull-up counter 354. If the ledge voltage is less than $V_{ref}$ 814-NO, then the buffer pull-up strength is too weak, as illustrated by FIG. 5B2. The logic circuit increases the pull-up strength 816 by incrementing the pull-up counter 354.

The logic circuit 300 then sets data to zero 820 transmitting a falling edge on the transmission line. After a short delay 822, the ledge voltage is sampled 824. The ledge voltage is compared to $V_{ref}$ 826 and the comparator output is latched 828. If the ledge voltage is less than $V_{ref}$ 830-YES, then the buffer pull-down strength is too great, as illustrated by FIG. 5C1. The logic circuit reduces the pull-down strength 834 by decrementing the pull-down counter 356. If the ledge voltage is greater than $V_{ref}$ 830-NO, then the buffer pull-down strength is too weak, as illustrated by FIG. 5C2. The logic circuit increases the pull-down strength 816 by incrementing the pull-down counter 356.

The logic circuit continues to transmit alternating rising and falling edges and adjusting the pull-up and pull-down counters to converge on values that produces a ledge voltage that is approximately equal to $V_{ref}$ for both rising edges produced by the pull-up driver and falling edges produced by the pull-down driver 836. In one embodiment, convergence is determined by detecting the occurrence of a convergence in the count value. In another embodiment, the adjusting cycle is repeated a fixed number of times that is sufficient to insure convergence in all cases.

When the adjusting process has converged, the pull-up counter 354 value is latched 838 into the pull-up value latch 104 and the pull-down counter 356 value is latched 838 into the pull-down value latch 106, thus programming the strengths of the output buffers 120. The first compensation buffer is disabled 840 and the transmission line compensation process ends 842.

The first compensation buffer 338 is used to drive the mode terminal 116 with a low level when terminated by a pull-up resistor 348 to perform resistive termination compensation. A second compensation buffer 350 is used to drive the mode terminal 116 with a high level. The compensation adjustment is carried out in two phases. In the first phase, the pull-down drivers of the first compensation buffer 338 are calibrated against the pull-up resistor 348. In the second phase, the pull-down drivers of the second compensation buffer 350 are programmed by the pull-down lines 112 with the value determined in the first phase. The pull-up drivers of the second compensation buffer 350 are then calibrated against the pull-down drivers of the second compensation buffer 350.

Figure 4:
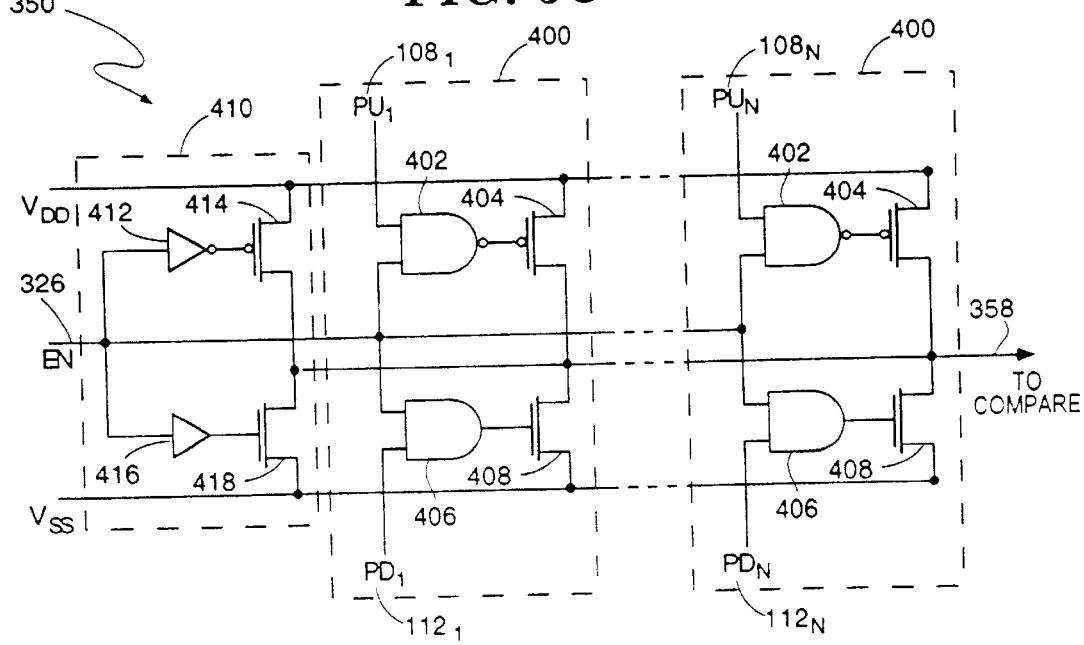
FIG. 4 is a representational circuit diagram for an exemplary compensation driver used in the compensation circuit.

An exemplary implementation of the second compensation buffer is shown in FIG. 4. The driver legs of the second compensation buffer are substantially similar to those of the first compensation buffer 338 and the output buffers 120. However, the second compensation buffer does not have a data input. Accordingly, the logic elements 402, 406, 412, 416 that drive the transistors have one less input than their counterparts in the first compensation and output buffers. All pull-up transistors 404 and pull-down transistors 408 in legs 400 that are enabled by the pull-up and pull-down values and both transistors 414, 418 in the anchor leg, if any, are turned on when the second compensation buffer is enabled. Thus, the pull-up drivers are working against the pull-down drivers whenever the second compensation buffer is enabled. The logic circuit supplies the enable signal 326 for the second compensation buffer. The pull-up and pull-down values are supplied by the pull-up counter 354 on pull-up lines 108 and the pull-down counter 356 on pull-down lines 112.

Figure 9A:
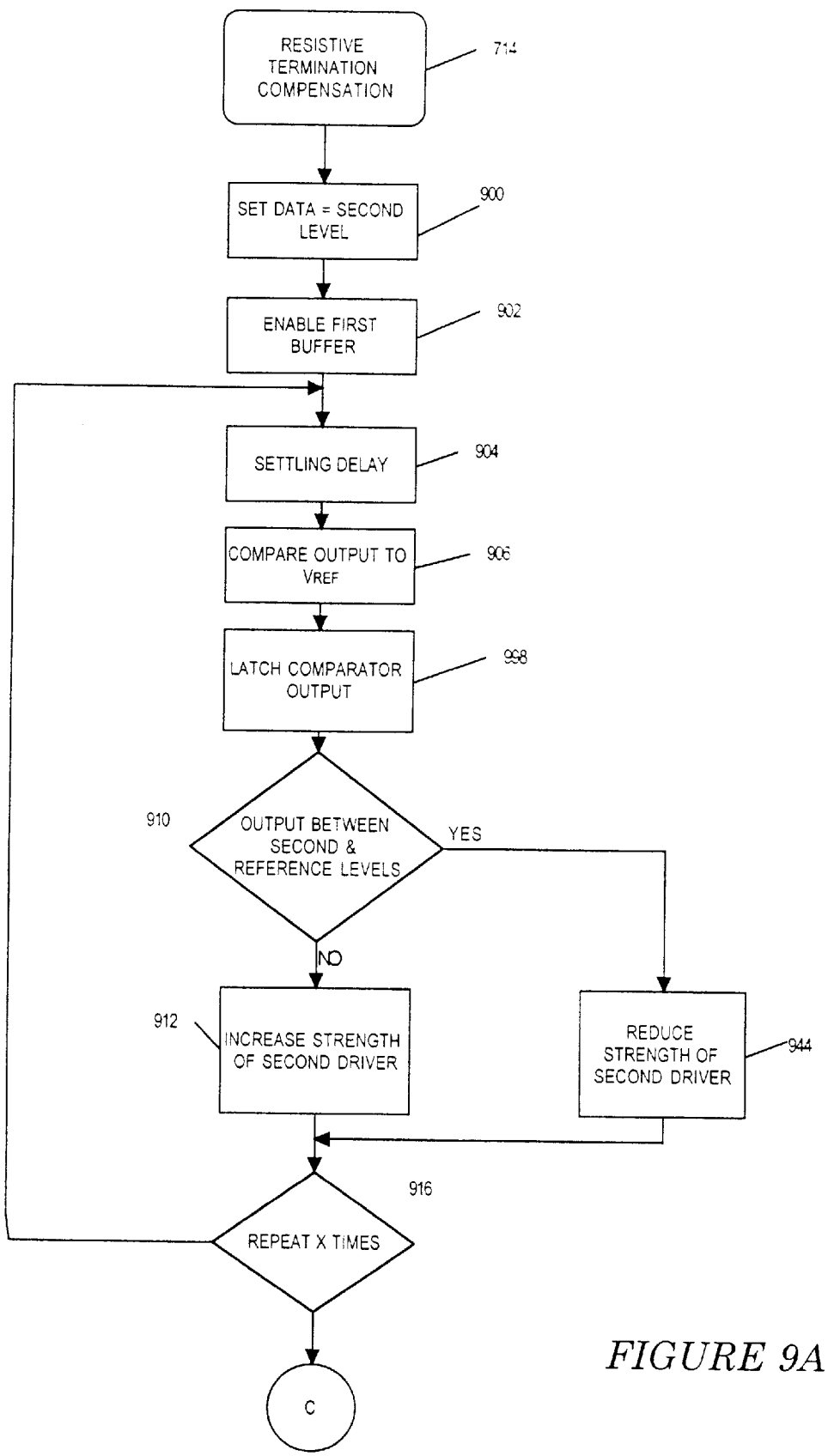
FIGS. 9A and 9B are a flowchart for the impedance compensation process in the resistive termination mode of an embodiment of the invention.
Figure 9B:
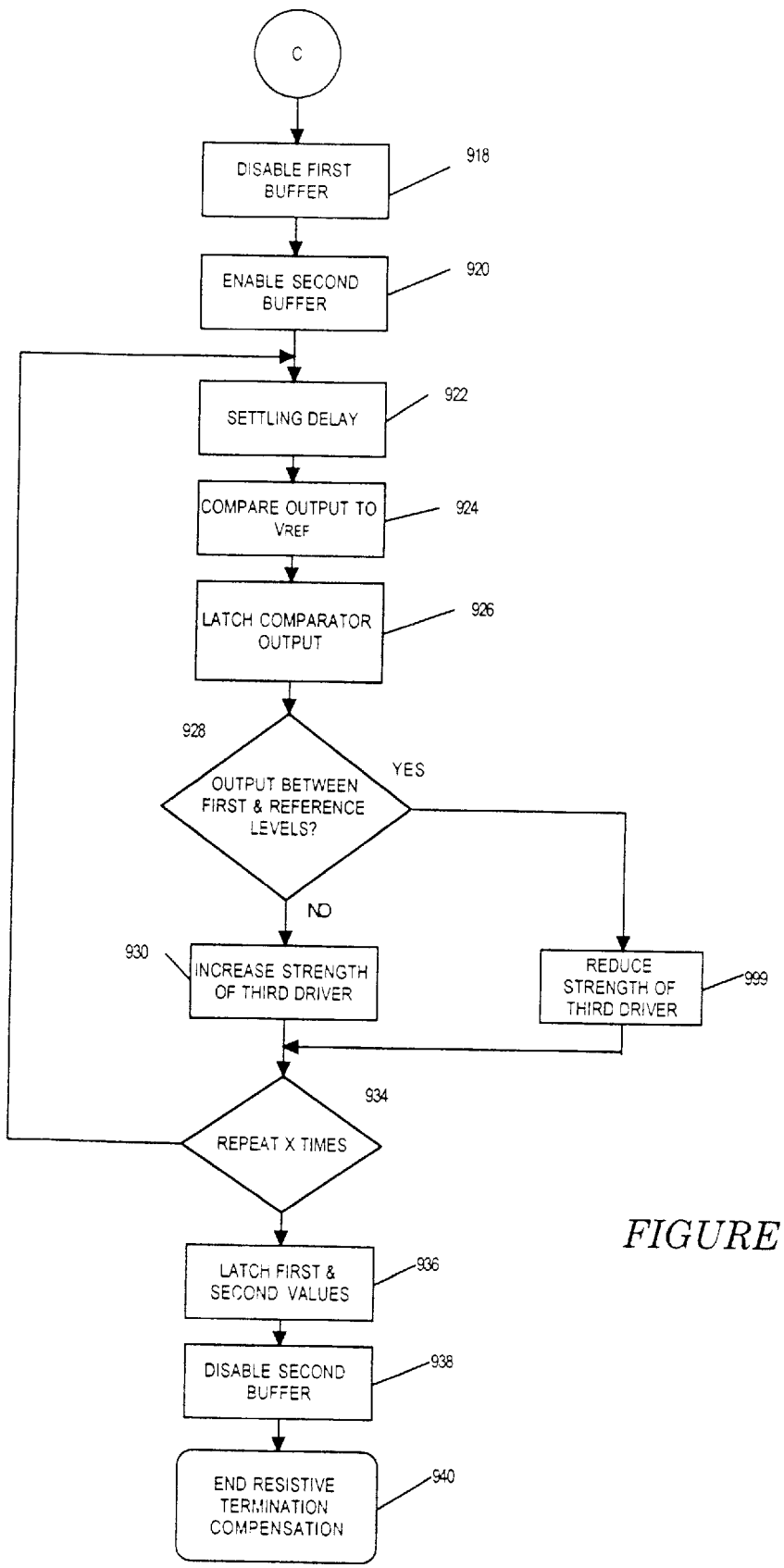

FIGS. 9A and 9B are exemplary flowcharts for the adjusting process in transmission line mode. FIG. 9A shows initialization and the first phase of the adjusting process for adjusting the pull-down value. FIG. 9B shows the second phase for adjusting the pull-up value and finalization.

The logic circuit 300 sets data 312 to zero 900 and sets the first buffer enable 314 to enable the first compensation buffer 902. This causes the first compensation buffer to drive the mode terminal 116 to the low state against the external pull-up resistors 348. It will be appreciated that resistive termination involves essentially steady state measurements as compared to the transient voltages that are measured in the unterminated transmission line mode. Therefore, the sample and hold is not required and the sample and hold line 310 is enabled to turn on the sample and hold transistor 334 throughout the first phase of the resistive termination mode compensation. The sample and hold circuit continues to provide a low-pass filtering effect, which stabilizes the compensation process.

Figure 6A:
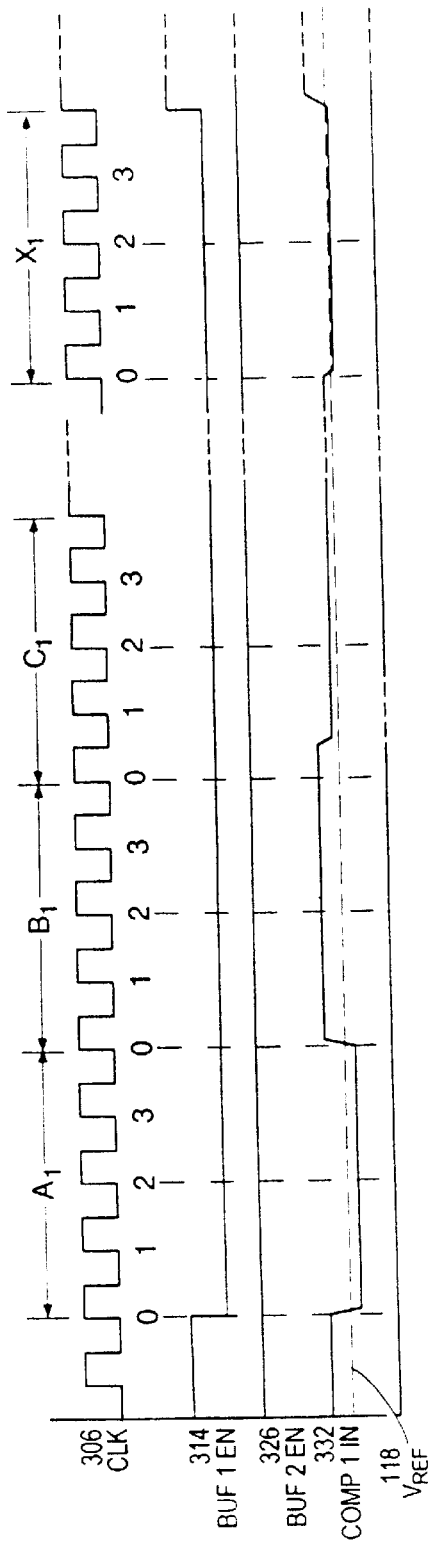
FIGS. 6A and 6B are an illustrative set of waveforms that may be generated by the compensation circuit in the resistive termination mode.
Figure 6B:
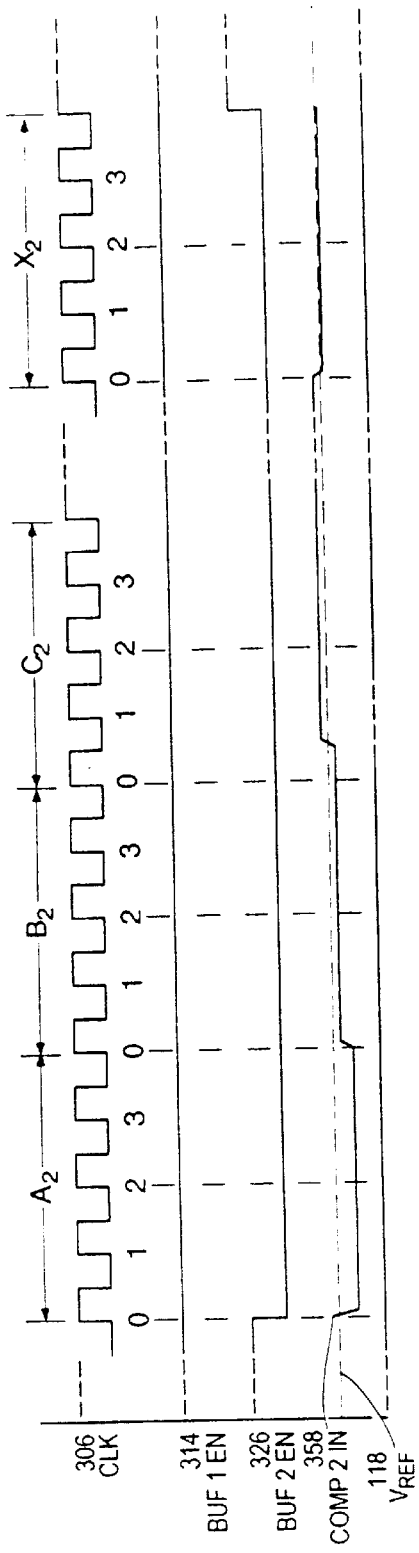

FIGS. 6A and 6B illustrate waveforms that may be present when the impedance compensation initialization circuit 102 is adjusting the impedance compensation in the resistive termination mode. FIG. 6A illustrates the first phase and shows the clock signal 306, the first buffer enable signal 314 that is supplied to the first compensation buffer 338, the second buffer enable signal 326 that is supplied to the second compensation buffer 350, the $V_{ref}$ level 118, and the voltage from the first compensation buffer 338 to the first comparator 332. It will be appreciated that the data signal 312 is zero whenever the first buffer enable signal 314 is enabled in resistive termination mode. FIG. 6B, continues from the right end of FIG. 6A and shows the second phase of the compensation process. All the signals shown in FIG. 6A are shown in FIG. 6B except that the voltage from the second compensation buffer 350 to the second comparator 352 is shown in place of the voltage to the first comparator 332. It will be observed that voltage to the second comparator 352 is completely undefined whenever the second compensation buffer 350 is disabled as nothing is driving this line 358.

After a settling delay 904, the voltage at the mode terminal 116 is compared to $V_{ref}$ 906 and the first comparator output 308 is latched 908. In resistive termination mode the settling delay is much longer than the delay 500 in unterminated transmission line mode, and may be approximately half the time between successive cycles. If the voltage is less than $V_{ref}$ 910-YES, then the buffer pull-down strength is too great, as illustrated by cycle $A_1$ in FIG. 6A. The logic circuit 300 reduces the pull-down strength 914 by decrementing the pull-down counter 356. If the voltage is greater than $V_{ref}$ 910-NO, then the buffer pull-down strength is too weak, as illustrated by cycle $B_1$ in FIG. 6A. The logic circuit increases the pull-down strength 912 by incrementing the pull-down counter 356.

The logic circuit continues to test the mode terminal 116 voltage and adjust the pull-down counter 356 to converge on a value for the pull-down counter that produces a voltage on the mode terminal that is approximately equal to $V_{ref}$ 916. In one embodiment, convergence is determined by detecting the occurrence of a convergence in the count value. In another embodiment, the adjusting cycle is repeated a fixed number of times that is sufficient to insure convergence in all cases.

When the pull-down value 110 has been adjusted in the first phase, the first compensation buffer 338 is disabled 918 and the second compensation buffer 350 is enabled 920. The strength of the pull-down driver of the second compensation buffer is set by the pull-down value determined in the first phase. When the second compensation buffer is enabled, the pull-up drivers are driving against the pull-down drivers because of the unique structure of the second compensation buffer as described above.

After a settling delay 922, the output voltage 358 from the second compensation buffer 350 is compared to $V_{ref}$ 924 and the second comparator output 328 is latched 926. If the voltage is greater than $V_{ref}$ 928-YES, then the buffer pull-up strength of the second compensation buffer is too great, as illustrated by cycle $C_2$ in FIG. 6B. The logic circuit 300 reduces the pull-up strength 932 by decrementing the pull-up counter 354. If the sampled voltage is greater than $V_{ref}$ 928-NO, then the buffer pull-up strength is too weak, as illustrated by cycle $A_2$ in FIG. 6B. The logic circuit increases the pull-up strength 930 by incrementing the pull-up counter 354. The logic circuit continues to test the second compensation buffer output voltage and adjust the pull-up counter to converge on a value for the pull-up counter that produces a voltage on the mode terminal that is approximately equal to $V_{ref}$ 934. Convergence is determined in the same way as in the first phase.

When the adjusting process of the second phase has converged, the pull-up counter 354 value is latched 936 into the pull-up value latch 104 and the pull-down counter 356 value is latched 936 into the pull-down value latch 106, thus programming the strengths of the output buffers 120. The second compensation buffer is disabled 938 and the resistive termination compensation process ends 940.

While certain exemplary embodiments have been described and shown in the accompanying drawings, it is to be understood that such embodiments are merely illustrative of and not restrictive on the broad invention. It will be realized by those skilled in the art that, while an exemplary embodiment has been described and shown with pull-up and pull-down resistors and transistors, that the pull-up devices can replaced with pull-down devices and pull-down devices replaced with pull-up devices within the scope of this invention. It should be appreciated that the signaling voltages may be any two distinct voltages which may or may not correspond to device supply voltages. The logical high data level may or may not be represented by the more positive of the two signaling voltages. It will also be appreciated that the reference voltage may be at any point between the signaling voltages and it is not limited to the midpoint between the signaling voltages. Therefore it is intended that the scope of the invention be limited only by the following claims.

What is claimed is:

1. A method of programming an output buffer having a first output driver for producing a first signaling level with a first programmable strength and a second output driver for producing a second signaling level with a second programmable strength, the method comprising:

coupling a test resistor between a source of the second signaling level and a mode terminal;

sensing a first level at the mode terminal;

uncoupling the test resistor from the mode terminal;

if the first level is between the second signaling level and a reference level, then programming the output buffer with reference to an unterminated transmission line coupled to the mode terminal; otherwise, programming the output buffer with reference to an external resistor coupled between a source of the first signaling level and the mode terminal.

2. The method of claim 1 wherein the test resistor is coupled to the mode terminal by a switch.

3. The method of claim 1 wherein the reference level is the reference level for a differential line receiver having an input, where the input of said differential line receiver is coupled to the output of said output buffer.

4. The method of claim 1 wherein programming the output buffer with reference to the unterminated transmission line further comprises:

determining values to program a first compensation buffer, said first compensation buffer having a first compensation driver for producing the first signaling level with the first programmable strength and a second compensation driver for producing the second signaling level with the second programmable strength, said values responsive to the mode terminal and the reference level;

programming the output buffer with the determined values.

5. The method of claim 4 wherein programming the first compensation buffer further comprises repeatedly:

adjusting the first compensation driver; and adjusting the second compensation driver;

for a number of times sufficient to converge on an adjustment of the first compensation driver and the second compensation driver.

6. The method of claim 4 wherein the number of repetitions of the adjusting of the first compensation driver and the adjusting of the second compensation driver is a predetermined number based on a number of programmable states for the compensation drivers.

7. The method of claim 5 wherein adjusting the first compensation driver further comprises:

causing the first compensation buffer to provide a transition from the second signaling level to the first signaling level at the mode terminal to produce a second level at the mode terminal;

after a delay, sampling and holding the second level;

if the sampled second level is between the first signaling level and the reference level, reducing the first programmable strength of the first compensation driver; otherwise, increasing the first programmable strength of the first compensation driver; and, adjusting the second compensation driver further comprises:

causing the first compensation buffer to provide a transition from the first signaling level to the second signaling level at the mode terminal to produce a third level at the mode terminal;

after the delay, sampling and holding the third level;

if the sampled third level is between the second signaling level and the reference level, reducing the second programmable strength of the second compensation driver; otherwise, increasing the second programmable strength of the second compensation driver.

8. The method of claim 7 wherein the delay between causing the transition at the mode terminal and sampling the level is longer than a maximum transition time of the compensation drivers and shorter than a reflection time for the transition to be reflected back to the mode terminal on the unterminated transmission line.

9. The method of claim 1 wherein programming the output buffer with reference to the external resistor further comprises:

determining a second value to program a first compensation buffer, said first compensation buffer having a second compensation driver for producing the second signaling level with the second programmable strength, said second value responsive to the mode terminal and the reference level;

programming the second programmable strength of a second compensation buffer with the second value, said second compensation buffer having a third compensation driver for producing the first signaling level with the first programmable strength and a fourth compensation driver for producing the second signaling level with the second programmable strength;

determining a first value to program the third compensation driver of the second compensation buffer, said first value responsive to the reference level and the second value;

programming the output buffer with the first and second values.

10. The method of claim 9 wherein programming the first compensation buffer further comprises adjusting the second compensation driver for a number of times sufficient to converge on the second value, and programming the second compensation buffer further comprises adjusting the third compensation driver for a number of times sufficient to converge on the first value.

11. The method of claim 10 wherein the number of times sufficient to converge on each of the first and second values is a predetermined number based on a number of programmable states for each of the compensation drivers.

12. The method of claim 9 wherein adjusting the second compensation driver further comprises:

causing the first compensation buffer to provide the second signaling level at the mode terminal to produce a fourth level at the mode terminal;

comparing the fourth level to the reference level;

if the fourth level is between the second signaling level and the reference level, reducing the second programmable strength of the second compensation driver; otherwise, increasing the second programmable strength of the second compensation driver;

and, adjusting the third compensation driver further comprises:

causing the second compensation buffer to enable both the third compensation driver and the fourth compensation driver to produce a fifth level;

comparing the fifth level to the reference level;

if the fifth level is between the first signaling level and the reference level, reducing the first programmable strength of the third compensation driver; otherwise, increasing the first programmable strength of the third compensation driver.

13. A compensation circuit for an output buffer having a first output driver for producing a first signaling level with a first programmable strength and a second output driver for producing a second signaling level with a second programmable strength, the compensation circuit comprising:

a mode terminal;

a test resistor switchably coupled to the mode terminal;

a first comparator coupled to the mode terminal to compare a first level at the mode terminal to a reference level;

a mode flag coupled to the first comparator such that, if the first level is between the second signaling level and the reference level, the mode flag is set to indicate that an unterminated transmission line is coupled to the mode terminal, otherwise, the mode flag is set to indicate that an external resistor is coupled between a source of the first signaling level and the mode terminal;

a first counter coupled to the first comparator, said first counter to produce a first value responsive to the mode flag, the mode terminal, and the reference level;

a first latch, coupled to the first counter and the first output driver, such that the adjusted first value is provided to the first output driver;

a second counter coupled to the first comparator, said second counter to produce a second value responsive to the mode flag, the mode terminal, and the reference level;

a second latch, coupled to the second counter and the second output driver, such that the adjusted second value is provided to the second output driver.

14. The compensation circuit of claim 13 wherein the reference level is further coupled to a reference input of a differential line receiver.

15. The compensation circuit of claim 13 further comprising:

a first compensation buffer having a first compensation driver and a second compensation driver, the drivers of the first compensation buffer being substantially similar to the drivers of the output buffer, said first compensation buffer coupled to the mode terminal;

the first counter further coupled to the first compensation driver and the first comparator, said first counter being adjusted to the first value such that a second level produced by a low level to high level transition generated by the first compensation buffer at the mode terminal is substantially the same as the reference level, if the mode flag is set to indicate that the unterminated transmission line is coupled to the mode terminal;

the second counter coupled to the second compensation driver and the first comparator, said second counter being adjusted to the second value such that a third level produced by a high level to low level transition at the mode terminal is substantially the same as the reference level, if the mode flag is set to indicate that the unterminated transmission line is coupled to the mode terminal.

16. The compensation circuit of claim 15 further comprising a sample and hold circuit that couples the mode terminal to the first comparator.

17. The compensation circuit of claim 13 further comprising:

a second comparator;

a second compensation buffer having a third compensation driver with the first programmable strength coupled to the first counter and a fourth compensation driver with the second programmable strength coupled to the second counter, the drivers of the second compensation buffer being substantially similar to the drivers of the output buffer, the output of said second compensation buffer coupled to the second comparator;

the second counter being adjusted to the second value such that a fourth level produced by the second signaling level at the mode terminal is substantially the same as the reference level, if the mode flag is set to indicate that the external resistor is coupled to the mode terminal;

the first counter being adjusted to the first value such that a fifth level generated by the second compensation buffer by enabling both the third compensation driver and the fourth compensation driver with said fifth level coupled to the second comparator is substantially the same as the reference level, if the mode flag is set to indicate that the external resistor is coupled to the mode terminal.

18. A data transmission system with impedance compensation comprising:

an output buffer having a first output driver for producing a first signaling level with a first programmable strength and a second output driver for producing a second signaling level with a second programmable strength;

a differential line receiver coupled to the output of the output buffer and a reference level;

a compensation circuit coupled to the output buffer to program the first and second programmable strengths, said compensation circuit further having a mode terminal;

a test resistor switchably coupled to the mode terminal;

a first comparator coupled to the mode terminal to compare a first level at the mode terminal to a reference level;

a mode flag coupled to the first comparator such that, if the first level is between the second signaling level and the reference level, the mode flag is set to indicate that an unterminated transmission line is coupled to the mode terminal, otherwise, the mode flag is set to indicate that an external resistor is coupled between a source of the first signaling level and the mode terminal;

a first counter coupled to the first comparator, said first counter to produce a first value responsive to the mode flag, the mode terminal, and the reference level;

a first latch, coupled to the first counter and the first output driver, such that the adjusted first value is provided to the first output driver;

a second counter coupled to the first comparator, said second counter to produce a second value responsive to the mode flag, the mode terminal, and the reference level;

a second latch, coupled to the second counter and the second output driver, such that the adjusted second value is provided to the second output driver.

19. The data transmission system of claim 18 wherein said compensation circuit further has:

a first compensation buffer having a first compensation driver and a second compensation driver, the drivers of the first compensation buffer being substantially similar to the drivers of the output buffer, said first compensation buffer coupled to the mode terminal;

the first counter further coupled to the first compensation driver and the first comparator, said first counter being adjusted to the first value such that a second level produced by a low level to high level transition generated by the first compensation buffer at the mode terminal is substantially the same as the reference level, if the mode flag is set to indicate that the unterminated transmission line is coupled to the mode terminal;

the second counter coupled to the second compensation driver and the first comparator, said second counter being adjusted to the second value such that a third level produced by a high level to low level transition at the mode terminal is substantially the same as the reference level, if the mode flag is set to indicate that the unterminated transmission line is coupled to the mode terminal.

20. The data transmission system of claim 19 wherein said compensation circuit further has a sample and hold circuit that couples the mode terminal to the first comparator.

21. The data transmission system of claim 18 wherein said compensation circuit further has:

a second comparator;

a second compensation buffer having a third compensation driver with the first programmable strength coupled to the first counter and a fourth compensation driver with the second programmable strength coupled to the second counter, the drivers of the second compensation buffer being substantially similar to the drivers of the output buffer, the output of said second compensation buffer coupled to the second comparator;

the second counter being adjusted to the second value such that a fourth level produced by the second signaling level at the mode terminal is substantially the same as the reference level, if the mode flag is set to indicate that the external resistor is coupled to the mode terminal;

the first counter being adjusted to the first value such that a fifth level generated by the second compensation buffer by enabling both the third compensation driver and the fourth compensation driver with said fifth level coupled to the second comparator is substantially the same as the reference level, if the mode flag is set to indicate that the external resistor is coupled to the mode terminal.

* * * * *